United States Patent
Blake et al.

(10) Patent No.: US 8,922,194 B2
(45) Date of Patent: Dec. 30, 2014

(54) MASTER-SLAVE FIBER OPTIC CURRENT SENSORS FOR DIFFERENTIAL PROTECTION SCHEMES

(75) Inventors: James N. Blake, Paradise Valley, AZ (US); Carl Glasow, Phoenix, AZ (US)

(73) Assignee: Alstom Technology Ltd, Baden (CH)

( * ) Notice: Subject to any disclaimer, the term of this patent is extended or adjusted under 35 U.S.C. 154(b) by 342 days.

(21) Appl. No.: 13/395,282

(22) PCT Filed: Sep. 10, 2010

(86) PCT No.: PCT/US2010/048392
§ 371 (c)(1),
(2), (4) Date: Apr. 10, 2012

(87) PCT Pub. No.: WO2011/031945
PCT Pub. Date: Mar. 17, 2011

(65) Prior Publication Data
US 2012/0187937 A1 Jul. 26, 2012

Related U.S. Application Data

(60) Provisional application No. 61/241,474, filed on Sep. 11, 2009.

(51) Int. Cl.
*G01R 31/00* (2006.01)
*G01R 33/032* (2006.01)

(52) U.S. Cl.
CPC .................. *G01R 33/032* (2013.01)
USPC ........................................................ 324/96

(58) Field of Classification Search
USPC ............... 324/96, 76.53–76.55, 76.11, 76.77, 324/120, 500, 522, 754.26
See application file for complete search history.

(56) References Cited

U.S. PATENT DOCUMENTS

| 5,247,171 | A | 9/1993 | Wlodarczyk et al. |
| 5,500,909 | A * | 3/1996 | Meier ............... 385/12 |
| 6,434,258 | B2 * | 8/2002 | Wiens ............. 382/113 |
| 6,434,285 | B1 * | 8/2002 | Blake et al. ........ 385/12 |
| 6,518,767 | B1 | 2/2003 | Roberts et al. |
| 2003/0031397 | A1 | 2/2003 | Bennett |
| 2006/0011840 | A1 | 1/2006 | Bryce et al. |
| 2009/0002712 | A1 | 1/2009 | Huang |

OTHER PUBLICATIONS

International Preliminary Report on Patentability issued in corresponding International Application No. PCT/US2010/048392 on Mar. 13, 2012.
International Search Report issued in corresponding International Application No. PCT/US2010/048392, mailed Oct. 29, 2010.
Chinese Office Action in corresponding Chinese Application No. 201080047578.2 dated Oct. 15, 2014.

* cited by examiner

*Primary Examiner* — Melissa Koval
*Assistant Examiner* — Trung Nguyen
(74) *Attorney, Agent, or Firm* — Patent Portfolio Builders PLLC (57) ABSTRACT

A master-slave current sensor system for measuring, for example, differential current on a transmission line is described. The slave current sensor can be periodically recalibrated (or have a compensation value re-calculated) based on the master sensor's average output, and the slave sensor can be unpowered and remote from an electronics box which receives its measurements. Health monitoring and fault location can also be performed using the master-slave optical current sensor system, optionally in conjunction with one or more voltage sensors.

22 Claims, 5 Drawing Sheets

MASTER-SLAVE FIBER OPTIC CURRENT SENSORS FOR DIFFERENTIAL PROTECTION SCHEMES

RELATED APPLICATION

This application is related to, and claims priority from, U.S. Provisional Patent Application No. 61/241,474, entitled "Master-Slave Fiber Optic Current Sensors for Differential Protections Schemes", to James N. Blake and Carl Glasow, filed on Sep. 11, 2009, the disclosure of which is incorporated here by reference.

BACKGROUND

The present invention pertains to fiber optic sensors and, particularly, to fiber optic current sensors which are used in differential protection schemes.

Today's electrical power transmission systems typically include high speed fault protection systems which, for example, operate to preserve the transient stability of the system and to provide better power quality through reduction in voltage sag durations. One type of fault protection system which is used with existing power transmission lines, e.g., those power lines with nominal voltages of 115 KV and greater, is the current differential system, which uses electrical current value information from the power line to determine whether a fault exists. Current differential systems, also known as line differential systems, do not require voltage measuring devices, as they do not use voltage values in their fault determinations and are, therefore, less sensitive to, for example, power swings and sudden load changes in the system than protection systems based on voltage sensors (although, as described below, voltage measurements can be used in conjunction with current measurements to perform, e.g., fault location). These systems operate by, for example, taking a first set of current measurements at one point on the transmission line, transmitting those measurements to a control station or relay, and comparing the first set of measurements with a second set of current measurements that were taken at a second point on the transmission line to determine if a fault exists on the line.

An example of such a line differential protection system is found in U.S. Pat. No. 6,518,767, the disclosure of which is incorporated here by reference. This protection system uses conventional current transformers (CTs) to sense the current in the power lines and provide inputs to the differential protection circuitry. More recently, however, fiber optic current sensors have been developed as alternatives to CT based current sensing systems. Such fiber optic current sensors operate based on the Faraday effect. Current flowing in a wire induces a magnetic field which, through the Faraday effect, rotates the plane of polarization of the light traveling in the optical fiber wound around the current carrying wire. Faraday's law can be stated as:

$$I = \oint H dL \quad (1)$$

where I is the electrical current, H is the magnetic field and the integral is taken over a closed path around the current. If the sensing fiber is wound around the current carrying wire with an integral number of turns, and each point in the sensing fiber has a constant sensitivity to the magnetic field, then the rotation of the plane of polarization of the light in the fiber depends on the current being carried in the wire and is insensitive to all externally generated magnetic fields such as those caused by currents carried in nearby wires. The angle, $\Delta\Phi$, through which the plane of polarization of light rotates in the presence of a magnetic field is given by:

$$\Delta\Phi = V \oint H \cdot dL \quad (2)$$

where V is the Verdet constant of the fiber glass.

The sensing optical fiber performs the line integral of the magnetic field along its path, which is proportional to the current in the wire, when that path closes on itself. Thus, $\Delta\Phi = VNI$ where N is the number of turns of sensing fiber wound around the current carrying wire. The rotation of the state of polarization of the light due to the presence of an electrical current can be measured by injecting light with a well-defined linear polarization state into the sensing region, and then analyzing the polarization state of the light after it exits the sensing region. Alternatively, $\Delta\Phi$ represents the excess phase shift encountered by a circularly polarized light wave propagating in the sensing fiber.

This technology is related to the in-line optical fiber current sensor as disclosed in U.S. Pat. No. 5,644,397 issued Jul. 1, 1997, to inventor James N. Blake and entitled "Fiber Optic Interferometric Circuit and Magnetic Field Sensor", which is incorporated herein by reference. Optical fiber sensors are also disclosed in U.S. Pat. No. 5,696,858 issued Dec. 9, 1997, to inventor James N. Blake and entitled, "Fiber Optics Apparatus and Method for Accurate Current Sensing" and U.S. Pat. No. 6,188,811 to James N. Blake and entitled "Fiber Optic Current Sensor", the disclosures of which are also incorporated herein by reference.

Accordingly, it would be desirable to adapt such optical current sensors for usage in, for example, differential protection schemes to monitor transmission lines.

SUMMARY

A master-slave optical current sensor system for measuring, for example, differential current on a transmission line is described. The slave current sensor can be periodically recalibrated (or have a compensation value re-calculated) based on the master's average output, and the slave sensor can be unpowered and remote from an electronics box which receives its measurements. Health monitoring and fault location can also be performed using the master-slave optical current sensor system, optionally in conjunction with one or more voltage sensors.

According to one exemplary embodiment, a method for measuring differential electrical current in a transmission line using master and slave current sensors, includes the steps of measuring a first electrical current value at a first location of the transmission line using a master current sensor, measuring a second electrical current value at a second location of the transmission line using a slave current sensor, wherein at least one of the master current sensor and the slave current sensor is an optical current sensor, determining a differential electrical current based on the first electrical current value and the second electrical current value, and recalibrating an output of the slave current sensor based on an output of the master current sensor.

According to another exemplary embodiment, an optical differential electrical current measurement system includes a master current sensor configured to measure a first electrical current value, a slave current sensor configured to measure a second electrical current value, wherein at least one of the master current sensor and the slave current sensor is an optical current sensor, and a controller configured to receive measurements from the master current sensor and the slave current sensor and configured to determining the differential electrical current based on the first electrical current value and the second electrical current value, wherein the controller is further configured to compensate the second electrical current value based upon an output of the master current sensor.

BRIEF DESCRIPTION OF THE DRAWINGS

The accompanying drawings illustrate exemplary embodiments of the present invention, wherein.

DETAILED DESCRIPTION

The following detailed description of the invention refers to the accompanying drawings. The same reference numbers in different drawings identify the same or similar elements. Also, the following detailed description does not limit the invention. Instead, the scope of the invention is defined by the appended claims.

Figure 1:
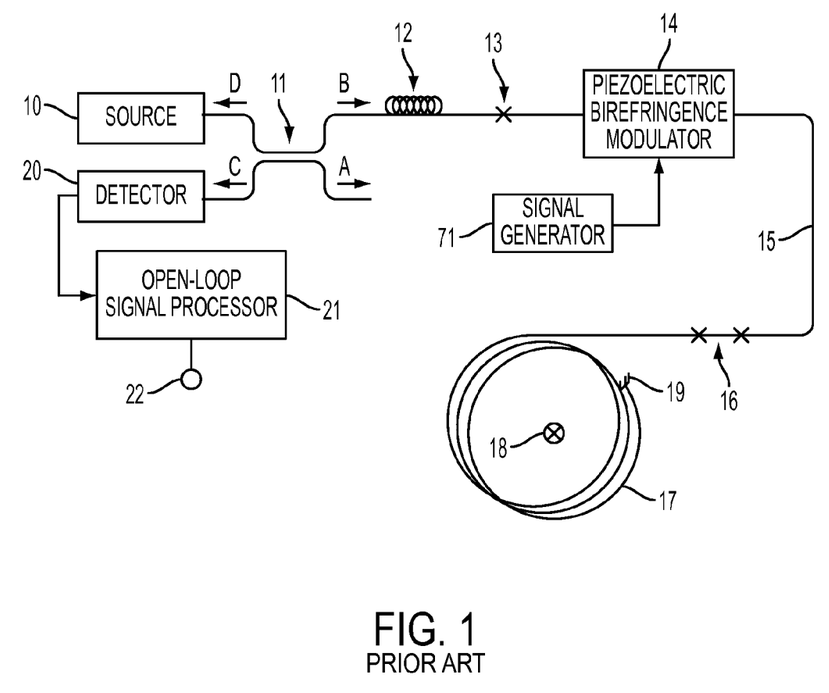
FIG. 1 depicts a first conventional fiber optic current sensor.

In order to provide some context for exemplary embodiments described herein, a fiber optic current sensor disclosed in the above-incorporated by reference '811 patent is reproduced herein as FIG. 1. Therein, light from source 10 propagates through coupler 11 and polarizer 12 to a 45-degree splice 13, where it divides equally into the two polarization states maintained throughout the rest of the optical circuit. Piezoelectric (PZT) birefringence modulator 14 differentially modulates the phases of the light in the two polarization states. Modulator 14 is driven by a modulator signal generator 71 that provides an electrical, periodic, alternating signal having either a square or sine wave. The light then propagates through delay line 15, through mode converter 16 which converts the two linear states of polarization into two circular states of polarization, and through optimized sensor coil 17. Optimized sensor coil 17 is wound around current carrying wire 18, e.g., a transmission line. The light reflects off reflective termination 19 and retraces its way through the optical circuit, finally arriving at detector 20. Open-loop signal processor 21 converts the detected signal to an output 22 which is indicative of the current flowing in current carrying wire 18. The '811 patent also describes embodiments wherein a Faraday rotator and mode converter can be used instead of the birefringence modulator 14 to passively bias a current sensor, as will be discussed in more detail below.

Coupler 11 can be implemented as a 3 dB optical coupling device which, however, also introduces intrinsic optical losses into the system. Intrinsic optical losses refer to losses which will exist in the fiber optic current sensor assuming ideal device characteristics and excluding losses external to the devices themselves, e.g., losses attributable to optical splices. For example, during the forward propagation from the light source 10 to the reflective termination 19, a portion (e.g., approximately half) of the light generated by light source 10 is coupled into the optical fiber 24 by coupler 11 and travels away from detector 20 (as represented by arrow A). This light energy can be dumped or otherwise discarded as it is not used in the current sensing measurement. The remainder of the light (represented by arrow B) travels toward the reflective termination 19 as described above, however about half of that light is lost in polarizer 12. When the light returns from the reflective termination 19, it again experiences losses as it passes through the polarizer 12. Assuming, for illustrative purposes, that the modulator 14 is designed to bias the current sensor to the quadrature point (described below), then the intrinsic optical losses associated with the polarizer 12 on the return path will again be approximately one-half of the light energy passing therethrough. The remaining light is again coupled into optical fiber 24, resulting in a portion of the light (represented by arrow C) traveling to the detector 20 and another portion (represented by arrow D) continuing on toward the source 10. Thus, considering the intrinsic losses, only approximately one-sixteenth of the light energy which was originally generated by light source 10 is actually returned to detector 20.

Figure 2:
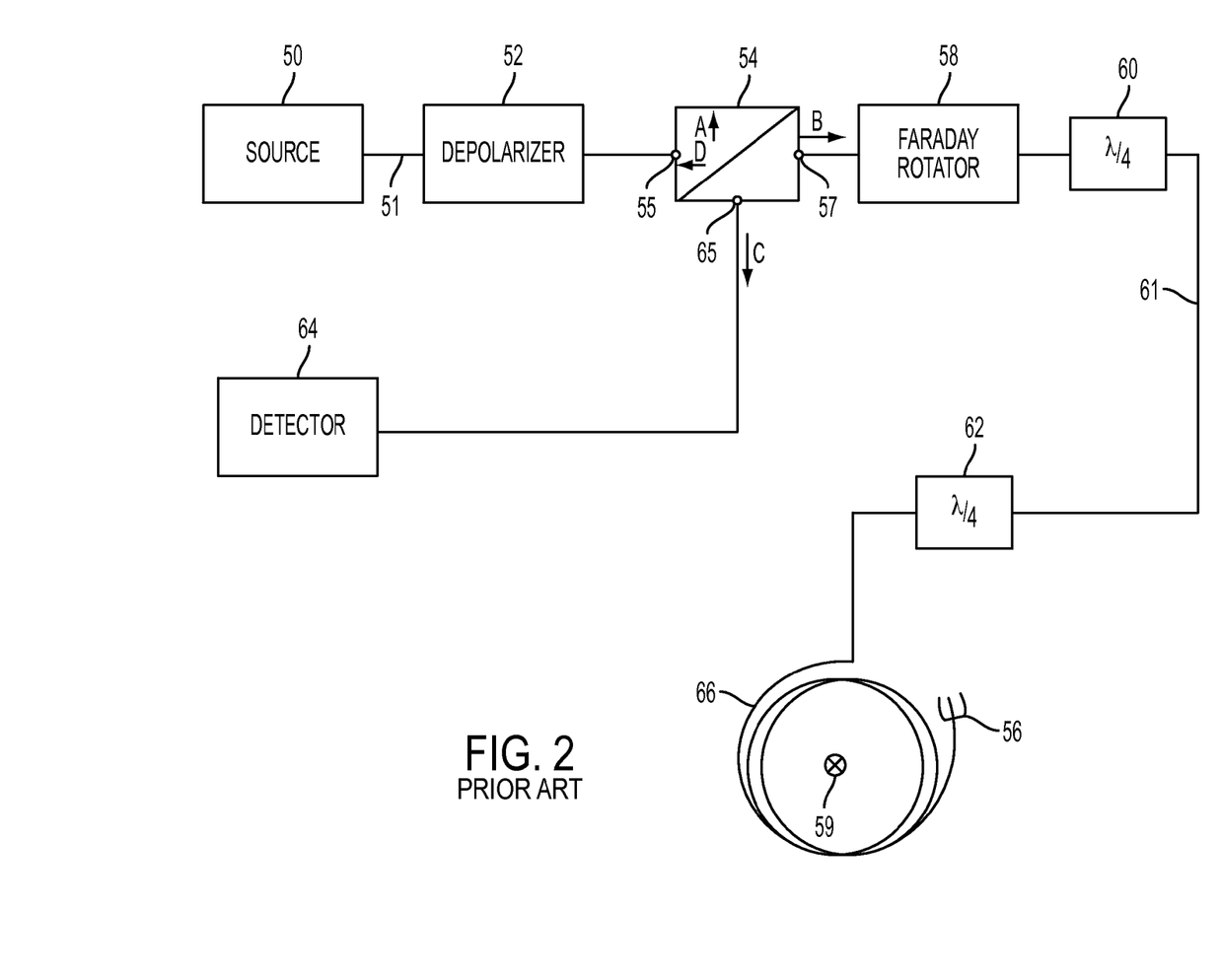
FIG. 2 depicts a second conventional fiber optic current sensor.

According to another known optical current sensing configuration, optical losses in such fiber optic current sensors can be reduced by using a polarization beam splitter to guide light toward the reflective termination during forward propagation and toward the detector during its return. An example is shown in FIG. 2. Therein, a light source 50 (e.g., a superluminescent diode (SLED)) emits light having a random polarization state which is coupled into a single mode (SM) optical fiber 51. The light is optionally depolarized by depolarizer 52 such that the polarization state of the light output from depolarizer 52 contains about one-half light having a first linear polarization state and the remainder of the light having a second linear polarization state which is orthogonal to the first linear polarization state.

The depolarized light travels on to the polarization beam splitter (PBS) 54 where it enters through port 55. The polarization beam splitter 54 operates to split the depolarized light into its two orthogonal polarization components. One polarization component (represented by arrow A) is reflected back from a splitting junction within the PBS 54 and is substantially scattered within the device (although some light could be reflected back through the port 55) and the other polarization component (represented by arrow B) is transmitted through port 57 of the PBS. Thus, in the forward propagation direction (i.e., from the source 50 to the reflective termination 56), the PBS 54 operates as a polarizer such that light having a single linear polarization state is conveyed to Faraday rotator 58.

The linearly polarized light which is incident upon the Faraday rotator 58 can be viewed as two, substantially equal, circularly polarized component waves, e.g., a right-hand circularly (RHC) polarized component wave and a left-hand circularly (LHC) polarized component wave. The Faraday rotator 58 operates to passively introduce a bias between the RHC component wave and the LHC component wave in order to improve the sensitivity of the detector to the amount of current flowing through wire 59, as will be described in more detail below with respect to FIG. 3. In this exemplary embodiment of the present invention, the Faraday rotator 58 introduces a phase shift of +22.5 degrees to one of the RHC and LHC component waves and a phase shift of −22.5 degrees to the other of the RHC and LHC component waves. The biased light energy is then output to quarter-wave plate ($\lambda/4$) 60 which operates as a mode converter to convert the circularly polarized light to linearly polarized light.

The linearly polarized light is then conveyed via a polarization maintaining (PM) fiber 61 to another quarter-wave plate 62 which operates as a mode converter to convert the linearly polarized light back into circularly polarized light. The quarter-wave plate 60, PM fiber 61 and quarter-wave plate 62 are provided as a mechanism to aid in maintaining the polarization states (and more significantly the relative phase shift between the polarization components) of the light since the detector 64 operates to detect this phase shift, from which the magnitude of the current flowing through conductor 59 is determined. Depending upon the particular implementation of fiber optic current sensors according to the present invention, the PM fiber 61 may have a length of anywhere from a meter or two to several hundred meters or more, over which length it is useful to maintain the polarization states of the components and the phase shift information. Linear polarization is employed for conveying the light over this part of the system because it is less sensitive to magnetic and stress effects which tend to degrade the purity of the polarization state of the light's component waves.

After the circularly polarized light is output from quarter-wave plate 62, it enters a sensing fiber 66 which encircles the wire 59 whose current being monitored. The detector 64 also achieves its greatest sensitivity when the circular states of polarization are well maintained throughout the sensing fiber 66. As described in the '811 patent, a spun birefringent fiber can preserve a circular state of polarization to some degree. However, it may be desirable that the circular state of polarization be well maintained so that a very long length (hundreds of meters) of sensing fiber can be used.

As discussed above with respect to the optical current sensor shown in FIG. 1, the current running through conductor 59 will introduce an additional phase shift between the RHC and LHC polarization component waves of the light passing through sensing fiber 66 according to $\Delta\Phi=VNI$, cumulatively 2VNI. The light will then reach reflective termination 56, e.g., a mirror, where it is reflected back through the sensing fiber 66 to quarter-wave plate 62. During the reverse propagation through sensing fiber 66, the RHC and LHC component waves of the light will acquire a second phase shift therebetween of 2VNI, for a total in the two passes of 4VNI. This second phase shift will be cumulative to the first phase shift (rather than offset it) because the polarization sense of the RHC and LHC component waves reverse upon incidence at the reflective termination and, on the reverse path, the light passes through the magnetic field generated by the current running through conductor 59 in the opposite direction.

The light will be converted back into linearly polarized light, by quarter-wave plate 62, for the return trip through PM fiber 61, and again back into circularly polarized light by quarter-wave plate 60. The light will be phase shifted again by Faraday rotator 58 such that the cumulative phase shift introduced between the RHC and LHC component waves is 90 degrees+4VNI. The light output from the Faraday rotator 58 then proceeds on to PBS 54. Some portion of the light output from the Faraday rotator 58 (an amount which depends upon the cumulative phase shift introduced along the forward and reverse paths) will have a polarization that causes it to be reflected from the path axis of the Faraday rotator 58 and directed out through the port 65 of the PBS 54 toward detector 64 (as represented by the arrow C in FIG. 2). The remainder of the light will be transmitted back through the port 55 of the PBS 54 toward the source 50 (as represented by the arrow D in FIG. 2) and can be isolated or dumped as desired. In this context, port 65 is the "non-reciprocal port" of PBS 54 since the light represented by arrow C is exiting the PBS 54 through a different port on its return path than the port (port 55) through which it entered the PBS 54 along the forward path. Conversely, the portion of the return light represented by arrow D exits the PBS 54 through the reciprocal port 55. Thus, this type of fiber optic current sensor detects the intensity of light returned through the non-reciprocal port of a polarization beam splitter to measure the current flowing through the measured conductor 59.

Figure 3:
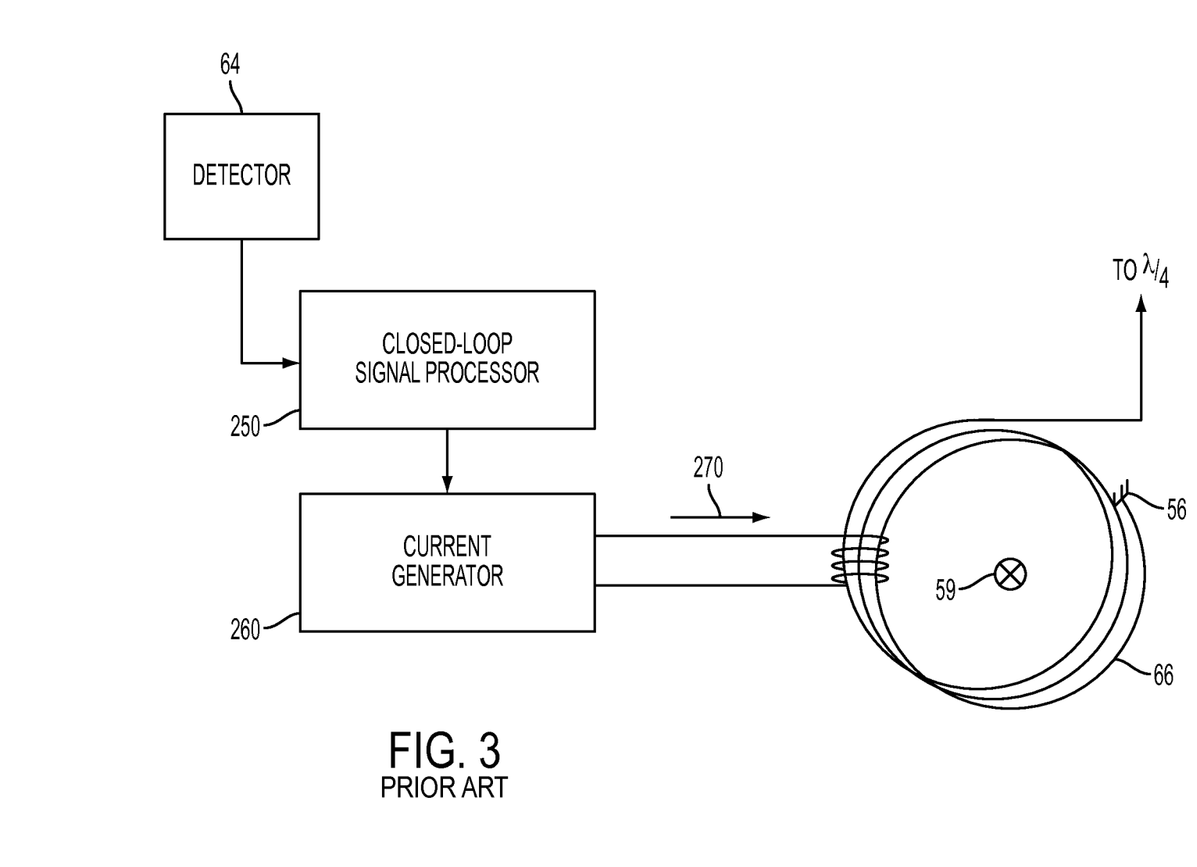
FIG. 3 is a block diagram illustrating a conventional closed loop control circuit.

It will be appreciated that the foregoing are simply examples of various fiber optic current sensors which can be used in differential protection schemes as described below, and that other types of fiber optic current sensors could be used instead. Numerous variations and permutations of the above-described exemplary current sensors are contemplated. For example, detector 64 can be connected to an open-loop signal processor for determining a current associated with the detected phase shift in a manner similar to that illustrated in FIG. 1. Alternatively, detector 64 can be connected to a closed-loop signal processor 250 which drives a current generator 260 that produces a phase nulling current as shown in FIG. 3, which illustrates only a portion of the fiber optic current sensor. The phase nulling current substantially cancels non-reciprocal phase shift produced by the current in current carrying wire 59. Another variation is that the Faraday rotator 58 and quarter-wave plate 60 can be replaced with a birefringence modulator and delay coil. In such embodiments, the quarterwave plate 60 can be omitted since the birefringence modulator operates on linearly polarized light. The Faraday rotator combination has the advantage, however, of being a passive device and therefore not requiring power. The optical elements 54, 58 and 60 can be packaged together as a single unit or can be implemented discretely. Additionally, a shield, e.g., a loop of wire, can be placed proximate the Faraday rotator 58 to shield the Faraday rotator against exposure to potentially large magnetic fields, if this portion of the fiber optic current sensor is disposed near the conductor 59.

Differential Protection Schemes Using Optical Current Sensors

According to exemplary embodiments, master-slave optical current sensors are used to take the current measurements used to provide differential current protection to, e.g., a transmission line, instead of systems based on current transformers. More specifically, a master-slave relationship is established between two optical current sensors measuring currents on the same line at two different points on the line 400 according to these exemplary embodiments as shown generally in FIG. 4. Therein, one current sensor 402 (represented conceptually by its current sensing loop) is the master, while the other current sensor 404 is the slave. According to some exemplary embodiments, the master current sensor 402 or the slave current sensor 404 may be implemented as any one of the optical current sensors described above with respect to FIGS. 1-3.

Figure 4:
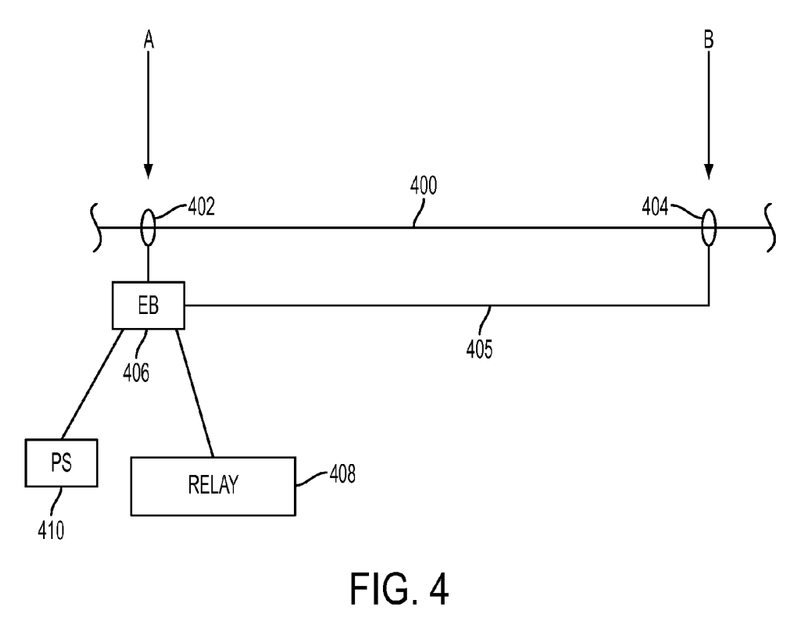
FIG. 4 illustrates master-slave optical current sensors used to provide differential protection to a transmission line according to an exemplary embodiment of the present invention.

The master optical current sensor 402 is thus used to take readings of the current passing through the line 400 at point A, while slave optical current sensor 404 is used to take readings of the current passing through the line 400 at point B. The readings taken by optical current sensor 402 are transmitted back to an electronics box (EB) 406 via fiber link 405. Points A and B may be separated by significant distances, e.g., up to 10 km (or more) and may, for example, include overhead to underground transitions of the line 400, the significance of which will be described in more detail below.

Over a period of time, the average (or instantaneous) current measured by the slave current sensor 404 is recalibrated in, e.g., the electronics box 406 (which may or may not be included in a relay 408), to match the average (or instantaneous) current of the master current sensor 402. This can be implemented by, for example, including a digital multiplier in the path of the signal processing for the slave optical current sensor in the electronics box 406 which compensates the received measurements from the slave optical current sensor. For example, a ratio of long term average values of the master and slave sensors can be used as an input to the multiplier to compensate the received values of the slave. Additionally, two sets of 3-phase sensing electronics can be housed in the same electronics box 406 allowing exemplary embodiments of the electronics implementation of the master-slave relationship integral to the function of the box, which can be powered by a power supply (PS) 410. According to one exemplary embodiment, this long term average can be on the order of 15 minutes, however it will be appreciated by those skilled in the art that other time periods can be used. This master-slave relationship between the optical current sensors 402 and 404 keeps the scale factors of the two sensors from drifting apart so that the difference between their measured currents remains substantially the same over time, notwithstanding that instantaneous changes in their measurements may occur due to faults in the line.

If there is a short-term fault between the two sensors 402 and 404 (e.g., if the line 400 arcs to another line or to ground, or lightning strikes between the two points), then the currents flowing through the two sensors 402 and 404 will be different. As described above, differential current protection can then be implemented based on the readings provided by these optical current sensors, e.g., as described in the above-incorporated by reference U.S. Pat. No. 6,518,767. The advantage of employing a master-slave relationship between the two sensors 402 and 404 according to these exemplary embodiments is that, with the master-slave relationship, the absolute accuracy of the individual optical sensors 402 and 404 can be significantly relaxed.

Suppose it is required that, in an illustrative differential protection scheme implementation, a differential current of 1% needs to be faithfully monitored. Without a master-slave relationship, each individual sensor would need to maintain better than +/−0.5% accuracy over the lifetime of the sensors. However, with a master-slave relationship employed according to these exemplary embodiments, the long term accuracy of the individual sensors could be very safely relaxed to +/−10%. The only requirement is that the sensors not drift by more than +/−0.5% during the control periods (e.g., every 15 minutes) between recalibrations of the slave sensor.

According to one exemplary embodiment, wherein for example both differential current and absolute current measurements are desired, a differential current measurement system can use one highly accurate optical current sensor (e.g., which measures current to within +/−1% of its actual value or less) and one not-so-accurate optical current sensor (e.g., which measures current to an accuracy which varies relative to the current's actual value by more than 1%, e.g., to +/−10% or greater variance). The highly accurate optical current sensor can be used as the master 402, and the not-so-accurate optical current sensor can be used as the slave 404. Then, the highly accurate sensor 402 can be used to provide the absolute current measurements for the line 400, while the two sensors 402 and 404 collaborate to provide the differential measurements for the line 400. As described above, some exemplary current sensors are active optical current sensors, e.g., using a PZT-based sensor, while other exemplary current sensors are passive optical current sensors, e.g., using a Faraday Rotator based sensor.

These different types of optical sensors have various characteristics which can be used, at least in part, to configure exemplary differential protection schemes according to these exemplary embodiments. For example, the active (PZT) based optical current sensor is very accurate while the passive (Faraday Rotator) based sensor is less accurate. However, the passive optical current sensor has two significant practical advantages over the active, PZT based optical current sensor. The first is that the passive optical current sensor is a lower cost product than the active optical current sensor. Secondly, the passive optical current sensor requires no electrical wires between the sensor and the electronics and can be placed up to 10 km from the control room. This allows for measuring differential currents 10 km apart without any electrical wiring (only a fiber optic connection 405). This embodiment is especially useful for measuring differential currents in underground transmission lines.

Thus, according to one exemplary embodiment, the master optical current sensor 402 can be implemented as one of the afore-described optical current sensors (FIGS. 1-3) which uses a PZT-type sensor, while the slave optical current sensor 404 can be implemented as one of the afore-described optical current sensors (FIGS. 1-3) using a Faraday rotator. This configuration may be useful when, for example, both absolute and differential current measurements are desired on line 400. Alternatively, if only differential protection is desired, two passive optical current sensors could be deployed as the master 402 and slave 404 optical current sensors in FIG. 4. Although these two exemplary embodiments are potentially particularly beneficial for the reasons described above, the present invention also contemplates and expressly includes the other two cases, i.e., (1) wherein the master 402 is a passive optical current sensor and the slave 404 is an active optical current sensor and (2) wherein both optical current sensors are implemented as active optical current sensors.

Thus, according to some exemplary embodiments, there is no need for powered infrastructure at the far end of the measuring system, e.g., where the slave optical current sensor 404 is disposed. In this regard note that power supply 410 can be disposed only on one end of the system proximate the electronics box 406 and master optical current sensor 402. This feature enables the remote sensor to be, for example, installed at an overhead-to-underground transition in the power line 400 which is common at the edge of a housing subdivision, and at the edge of a city and is especially useful for protecting underground power cables. For example, by providing current sensors on both sides of the underground power line it becomes possible to directly detect whether a fault is in the overhead part of the line, or in the underground part of the line. In this way, if the fault is on the overhead part of the line 400, then the circuit breakers provided in relay 408 should automatically re-close after the fault has been cleared. Usually overhead line faults are temporary, and power should be automatically restored after the circuit breakers have tripped off for a short duration.

On the other hand, if the fault is determined to be in the underground portion of the power line 400, it is undesirable to automatically re-close the circuit breakers after the fault is cleared since the problem with the underground line is most likely not temporary. Thus, the circuit breaker re-closing scheme can vary depending on whether the fault is determined to be above ground or underground. According to exemplary embodiments, with sensors on opposite sides of the underground part of a line 400, for example, the system can directly tell whether the fault is underground (between the sensors) or above ground (not between the sensors). When two sensors 402 and 404 are positioned at opposite ends of an underground line, and when the fault is located in the underground portion of the line, then the two sensors 402 and 404 will provide different current readings. By way of contrast, when the fault is the above ground portion of the line, these two sensors 402 and 404 on opposite sides of the underground portion of the line will provide the same or similar current readings. Thus exemplary embodiments enable the relay 408, for example, to make a decision whether or not to re-close the breaker by the direct measurements which are provided by electronics box 406.

Figure 5:
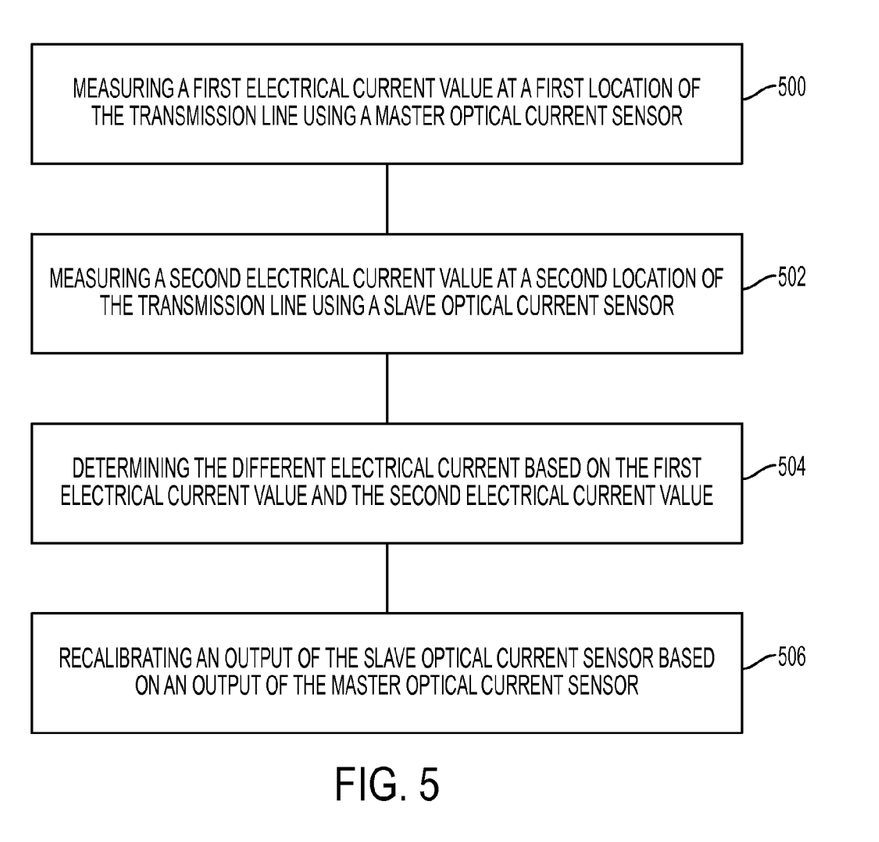
FIG. 5 is a flow chart illustrating a method for measuring differential electrical current in a transmission line using master and slave current sensors according to an exemplary embodiment.

Thus, according to one exemplary embodiment, a method for measuring differential electrical current in a transmission line using master and slave optical current sensors, can include the steps shown in the flowchart of FIG. 5. Therein, at step 500 a first electrical current value is measured at a first location of the transmission line using a master optical current sensor. A second electrical current value is measured at a second location of the transmission line using a slave optical current sensor as shown in step 502. The differential electrical current is determined based on the first electrical current value and the second electrical current value as shown in step 504. At step 506, an output of the slave optical current sensor is recalibrated based on an output of the master optical current sensor. Note that, as described in more detail below, although FIGS. 4 and 5 depict that both the master current sensor 402 and the slave current sensors 404 according to this exemplary embodiment are optical current sensors, at least one of these sensors 402 and 404 may be implemented in other exemplary embodiments using non-optical, current sensing technology.

The foregoing exemplary embodiments enable, for example, fault detection/location to be performed. According to other exemplary embodiments, the system illustrated in FIG. 4 can, also or alternatively, be used to monitor the health of the power line 400 between the two sensors 402 and 404. Consider that power line 400, particularly over long distances between point A and point B, will typically be manufactured as a plurality of line sections which are joined together. A degraded line tends to have small intermittent arcs at its joints which arc to ground. These small, intermittent arcs result in measurements by the sensors 402 and 404 which show the existence of noisy differential current on the line 400. Generally speaking, such intermittent arcs in e.g., an underground section (or any section) of the line 400 between two sensors 402 and 404 result in current passing through one sensor 402 differently than through the other sensor 404 due to the arcs in sections between the two sensors. For example, some of the current which is flowing from the line to ground at a given joint may be drawn from one side of the line between the two sensors, while some of the current may be drawn from the other side. Thus, a health monitoring function, e.g., disposed within electronics box 406 and/or relay 408, can use the measurements provided by sensors 402 and 404 to compare, for example, the noise in the measurements at point A relative to the noise in the measurements at point B as an indication of the health of the line 400. More specifically, it is anticipated that in a "healthy" line 400, i.e., a line with relatively little arcing or sparking to ground at the joints, the noise at points A and B would be substantially similar, whereas in an "unhealthy" line 400, i.e., a line with more substantial arcing or sparking to ground at the joints, there would be a substantial difference in the noise measured at points A and B, e.g., the noise values at points A and B would be anti-correlated relative to one another and a magnitude of such anti-correlated noise can be used to determine a relative health of a transmission line 400. Health monitoring according to such an exemplary embodiment allows, for example, replacement schedules for sections of a line 400 to be intelligently prioritized.

Although the foregoing exemplary embodiments focus on optical current sensing using a master-slave optical current sensor combination, such exemplary embodiments do not exclude the usage of voltage measurements as well, e.g., using an optical voltage measurement device. For example, the differential current measurement device illustrated above with respect to FIG. 4 can be combined with a fault location relay (sometimes called a "distance relay"). To perform this fault location, voltage information at one end of the line 400 can be used, e.g., at electronics box 406, which would normally be located at a substation along with suitable voltage sensors. By comparing currents and voltages during a fault, the location of the fault can be, at least roughly, determined.

The functions described above, e.g., determining a differential current value and/or compensating values received from the slave optical current sensor may be performed in the electronics box 406 which is separated from the relay 408, or may be performed in the relay itself, or in some other location/device/housing, all of which are collectively referred to as a "controller". Moreover, although the exemplary embodiments described above depict both the master and slave sensors as being optical, it is not required that both current sensors be optical currents sensors. Alternatively, one of the sensors can be a non-optical current sensor, e.g., a transformer-based current sensor. According to some exemplary embodiments, however, it may be desirable that at least one of the current sensors be an optical current sensor, e.g., a sensor which is disposed in a location where it is difficult to power the device and/or which is remote from the controller.

The above-described exemplary embodiments are intended to be illustrative in all respects, rather than restrictive, of the present invention. Thus the present invention is capable of many variations in detailed implementation that can be derived from the description contained herein by a person skilled in the art. All such variations and modifications are considered to be within the scope and spirit of the present invention as defined by the following claims. No element, act, or instruction used in the description of the present application should be construed as critical or essential to the invention unless explicitly described as such. Also, as used herein, the article "a" is intended to include one or more items.

The invention claimed is:

1. A method for measuring differential electrical current in a transmission line using master and slave current sensors, the method comprising the steps of:
measuring a first electrical current value at a first location of said transmission line using a master current sensor;
measuring a second electrical current value at a second location of said transmission line using a slave current sensor, wherein at least one of said master current sensor and said slave current sensor is an optical current sensor;
determining said differential electrical current based on said first electrical current value and said second electrical current value; and
recalibrating an output of said slave current sensor based on an output of said master current sensor,
wherein said step of recalibrating further comprises:
recalibrating said output of said slave current sensor by multiplying said output of said slave current sensor by a ratio of an average output of said master current sensor to an average output of said slave current sensor.

2. The method of claim 1, wherein said step of recalibrating is performed periodically.

3. The method of claim 1, wherein at least one of said master current sensor and said slave current sensor has a relatively high accuracy such that said at least one of said master current sensor and said slave current sensor is capable of measuring a respective one of said first electrical current and said second electrical current to within one percent or less of an actual value of electrical current passing through said transmission line.

4. The method of claim 1, wherein at least one of said master current sensor and said slave current sensor has a relatively low accuracy such that said at least one of said master current sensor and said slave current sensor is capable of measuring a respective one of said first electrical current and said second electrical current to greater than one percent of an actual value of electrical current passing through said transmission line.

5. The method of claim 4, wherein said at least one of said master current sensor and said slave current sensor is capable of measuring a respective one of said first electrical current and said second electrical current with an error of greater than ten percent of an actual value of electrical current passing through said transmission line.

6. The method of claim 1, wherein at least one of said master current sensor and said slave current sensor is a passive, unpowered device.

7. The method of claim 6, wherein said passive, unpowered device includes a Faraday rotator.

8. The method of claim 1, wherein at least one of said master current sensor and said slave current sensor is an active, powered device.

9. The method of claim 8, wherein said active, powered device includes a piezoelectric birefringence modulator.

10. The method of claim 1, further comprising:
using said first electrical current value and said second electrical current value to monitor a health of said transmission line.

11. The method of claim 10, further comprising:
determining a magnitude of anti-correlated noise associated with said first electrical current value and said second electrical current value to monitor said health of said transmission line.

12. An optical differential electrical current measurement system comprising:
a master current sensor configured to measure a first electrical current value;
a slave current sensor configured to measure a second electrical current value, wherein at least one of said master current sensor and said slave current sensor is an optical current sensor;
a controller configured to receive measurements from said master current sensor and said slave current sensor and configured to determining said differential electrical current based on said first electrical current value and said second electrical current value, and wherein said controller is further configured to compensate said second electrical current value based upon an output of said master current sensor; and
a multiplier configured to multiplying said second electrical current value by a ratio of an average output of said master current sensor to an average output of said slave current sensor to perform said compensation.

13. The optical differential electrical current measurement system of claim 12, wherein at least one of said master current sensor and said slave current sensor has a relatively high accuracy such that said at least one of said master current sensor and said slave current sensor is capable of measuring a respective one of said first electrical current and said second electrical current to within one percent or less of an actual value of electrical current passing through said transmission line.

14. The optical differential electrical current measurement system of claim 12, wherein at least one of said master current sensor and said slave current sensor has a relatively low accuracy such that said at least one of said master current sensor and said slave current sensor is capable of measuring a respective one of said first electrical current and said second electrical current to greater than one percent of an actual value of electrical current passing through said transmission line.

15. The optical differential electrical current measurement system of claim 14, wherein said at least one of said master current sensor and said slave current sensor is capable of measuring a respective one of said first electrical current and said second electrical current with an error of greater than ten percent of an actual value of electrical current passing through said transmission line.

16. The optical differential electrical current measurement system of claim 12, wherein at least one of said master current sensor and said slave current sensor is a passive, unpowered device.

17. The optical differential electrical current measurement system of claim 16, wherein said passive, unpowered device includes a Faraday rotator.

18. The optical differential electrical current measurement system of claim 12, wherein at least one of said master current sensor and said slave current sensor is an active, powered device.

19. The optical differential electrical current measurement system of claim 18, wherein said active, powered device includes a piezoelectric birefringence modulator.

20. The optical differential electrical current measurement system of claim 12, further comprising:
a health monitoring module configured to use said first electrical current value and said second electrical current value to monitor a health of said transmission line.

21. The optical differential electrical current measurement system of claim 20, wherein said health monitoring module is further configured to determine a magnitude of anti-correlated noise associated with said first electrical current value and said second electrical current value to monitor said health of said transmission line.

22. The optical differential electrical current measurement system of claim 12, wherein said controller is part of either (a) a relay or (b) an electronics box separated from said relay.

* * * * *